United States Patent
Hsu et al.

(10) Patent No.: US 6,677,239 B2
(45) Date of Patent: Jan. 13, 2004

(54) METHODS AND COMPOSITIONS FOR CHEMICAL MECHANICAL POLISHING

(75) Inventors: Wei-Yung Hsu, Santa Clara, CA (US); Gopalakrishna B. Prabhu, Sunnyvale, CA (US); Lizhong Sun, San Jose, CA (US); Daniel A. Carl, Pleasanton, CA (US)

(73) Assignee: Applied Materials Inc., Santa Clara, CA (US)

( * ) Notice: Subject to any disclaimer, the term of this patent is extended or adjusted under 35 U.S.C. 154(b) by 14 days.

(21) Appl. No.: 09/939,112

(22) Filed: Aug. 24, 2001

(65) Prior Publication Data

US 2003/0040182 A1 Feb. 27, 2003

(51) Int. Cl.$^7$ .............................................. H01L 21/00
(52) U.S. Cl. ........................ 438/692; 216/38; 216/88; 216/89; 252/79.1; 438/693; 438/745
(58) Field of Search ................................ 438/692, 693, 438/745, 756; 156/345.12; 216/38, 88, 89, 91; 252/79.4, 79.5, 79.1

(56) References Cited

U.S. PATENT DOCUMENTS

| | | | |
|---|---|---|---|
| 4,169,337 A | 10/1979 | Payne | 51/283 R |
| 4,588,421 A | 5/1986 | Payne | 51/308 |
| 4,752,628 A | 6/1988 | Payne | 523/122 |
| 4,867,757 A | 9/1989 | Payne | 51/293 |
| 5,152,917 A | 10/1992 | Pieper et al. | 541/295 |
| 5,244,534 A | 9/1993 | Yu et al. | 156/636 |
| 5,342,419 A | 8/1994 | Hibbard | 51/308 |
| 5,368,619 A | 11/1994 | Culler | 51/308 |
| 5,378,251 A | 1/1995 | Culler et al. | 51/308 |
| 5,395,801 A | 3/1995 | Doan et al. | 437/225 |
| 5,453,312 A | 9/1995 | Haas et al. | 428/143 |
| 5,614,444 A | 3/1997 | Farkas et al. | 437/225 |
| 5,692,950 A | 12/1997 | Rutherford et al. | 451/552 |
| 5,738,574 A | 4/1998 | Tolles et al. | 451/288 |
| 5,738,800 A | 4/1998 | Hosali et al. | 216/99 |
| 5,759,917 A | 6/1998 | Grover et al. | 438/690 |

(List continued on next page.)

FOREIGN PATENT DOCUMENTS

| | | |
|---|---|---|
| EP | 1 068 928 A1 | 1/2000 |
| EP | 1 061 111 A1 | 12/2000 |
| JP | 2000156360 | 6/1999 |
| JP | 2000068371 | 3/2000 |
| WO | 99 46081 | 9/1999 |
| WO | 00 02235 | 1/2000 |
| WO | 00/30159 | 5/2000 |
| WO | 00/49647 | 8/2000 |
| WO | 00/53691 | 9/2000 |

OTHER PUBLICATIONS

PCT Search Report for US 02/22587 dated Apr. 14, 2003.

*Primary Examiner*—William A. Powell
(74) *Attorney, Agent, or Firm*—Moser, Patterson & Sheridan

(57) ABSTRACT

Methods and apparatus are provided for planarizing substrate surfaces with selective removal rates and low dishing. One aspect of the method provides for processing a substrate including providing a substrate to a polishing platen having polishing media disposed thereon, providing an abrasive free polishing composition comprising one or more surfactants to the substrate surface to modify the removal rates of the at least the first dielectric material and the second dielectric material, polishing the substrate surface, and removing the second material at a higher removal rate than the first material from a substrate surface. One aspect of the apparatus provides a system for processing substrates including a platen adapted for polishing the substrate with polishing media and a computer based controller configured to perform one aspect of the method.

33 Claims, 5 Drawing Sheets

U.S. PATENT DOCUMENTS

| | | |
|---|---|---|
| 5,769,689 A | 6/1998 | Cossaboon et al. ............ 451/41 |
| 5,804,507 A | 9/1998 | Perlov et al. ................ 438/692 |
| 5,922,620 A | 7/1999 | Shimomura et al. ......... 438/693 |
| 5,932,486 A | 8/1999 | Cook et al. .................. 438/692 |
| 5,951,724 A | 9/1999 | Hanawa et al. ................ 51/309 |
| 5,968,239 A | 10/1999 | Miyashita et al. ............... 106/3 |
| 5,981,394 A | 11/1999 | Ohashi et al. ............... 438/692 |
| 5,981,396 A | 11/1999 | Robinson et al. ............ 438/692 |
| 6,019,806 A | 2/2000 | Sees et al. ..................... 51/308 |
| 6,042,741 A | 3/2000 | Hosali et al. .............. 252/79.1 |
| 6,043,155 A | 3/2000 | Homma et al. ............. 438/691 |
| 6,054,379 A | 4/2000 | Yau et al. .................... 438/623 |
| 6,060,395 A | 5/2000 | Skrovan et al. ............. 438/692 |
| 6,099,604 A | 8/2000 | Sandhu et al. ................. 51/307 |
| 6,114,249 A | 9/2000 | Canaperi et al. ............. 438/692 |
| 6,136,218 A | 10/2000 | Skrovan et al. ............ 252/79.1 |
| 6,149,830 A | 11/2000 | Lin et al. ....................... 216/89 |
| 6,193,790 B1 | 2/2001 | Tani ............................... 106/3 |
| 6,221,118 B1 | 4/2001 | Yoshida et al. ................ 51/309 |
| 6,224,464 B1 * | 5/2001 | Nojo et al. ..................... 216/88 |
| 6,294,105 B1 | 9/2001 | Feeney et al. ............. 252/79.1 |
| 6,303,506 B1 * | 10/2001 | Nojo et al. .................. 438/692 |
| 6,316,366 B1 | 11/2001 | Kaufman et al. ............ 438/693 |
| 6,358,850 B1 * | 3/2002 | Economikos et al. ........ 438/692 |
| 6,376,381 B1 * | 4/2002 | Sabde ........................ 438/693 |
| 6,383,934 B1 * | 5/2002 | Sabde et al. ................ 438/692 |
| 6,435,942 B1 | 8/2002 | Jin et al. ....................... 451/8 |
| 6,468,910 B1 | 10/2002 | Srinivasan et al. ......... 438/692 |
| 2001/0036738 A1 | 11/2001 | Hatanaka et al. ........... 438/693 |
| 2002/0028581 A1 * | 3/2002 | Yasui et al. ................. 438/689 |

* cited by examiner

US 6,677,239 B2

METHODS AND COMPOSITIONS FOR CHEMICAL MECHANICAL POLISHING

BACKGROUND OF THE INVENTION

1. Field of the Invention

The invention relates generally to the fabrication of semiconductor devices and to polishing and planarizing substrates.

2. Background of the Related Art

Reliably producing sub-half micron and smaller features is one of the key technologies for the next generation of very large scale integration (VLSI) and ultra large-scale integration (ULSI) of semiconductor devices. However, as the fringes of circuit technology are pressed, the shrinking dimensions of interconnects in VLSI and ULSI technology has placed additional demands on the processing capabilities. The multilevel interconnects that lie at the heart of this technology require precise processing of high aspect ratio features, such as vias, contacts, lines, and other interconnects. Reliable formation of these interconnects is important to VLSI and ULSI success and to the continued effort to increase circuit density and quality of individual substrates and die.

Multilevel interconnects are formed by the sequential deposition and removal of materials from the substrate surface to form features therein. As layers of materials are sequentially deposited and removed, the uppermost surface of the substrate may become non-planar across its surface and require planarization prior to further processing. Planarizing a surface, or "polishing" a surface, is a process where material is removed from the surface of the substrate to form a generally even, planar surface. Planarization is useful in removing excess deposited material and removing undesired surface topography and surface defects, such as rough surfaces, agglomerated materials, crystal lattice damage, scratches, and contaminated layers or materials to provide an even surface for subsequent processing.

Chemical mechanical planarization, or chemical mechanical polishing (CMP), is a common technique used to planarize substrates. In conventional CMP techniques, a substrate carrier or polishing head is mounted on a carrier assembly and positioned in contact with a polishing media in a CMP apparatus. The carrier assembly provides a controllable pressure to the substrate urging the substrate against the polishing media. The substrate and polishing media are moved in a relative motion to one another.

A polishing composition is provided to the polishing media to effect chemical activity in removing material from the substrate surface. The polishing composition may contain abrasive material to enhance the mechanical activity between the substrate and polishing media. Thus, the CMP apparatus effects polishing or rubbing movement between the surface of the substrate and the polishing media while dispersing a polishing composition to effect both chemical activity and mechanical activity. The chemical and mechanical activity removes excess deposited materials as well as planarizing a substrate surface.

Chemical mechanical polishing may be used in the fabrication of shallow trench isolation (STI) structures. STI structures that may be used to separate transistors and components of a transistor, such as source/drain junctions or channel stops, on a substrate surface during fabrication. STI structures can be formed by depositing a series of dielectric materials and polishing the substrate surface to remove excess or undesired dielectric materials. An example of a STI structure includes depositing a silicon nitride layer on an oxide layer formed on a doped silicon substrate surface, patterning and etching the substrate surface to form a feature definition, depositing a silicon oxide fill of the feature definitions, and polishing the substrate surface to remove excess silicon oxide to form a feature. The silicon nitride layer may perform as a hard mask during etching of the features in the substrate and/or as a polishing stop during subsequent polishing processes. Such STI fabrication processes require polishing the silicon oxide layer to the silicon nitride layer with a minimal amount of silicon nitride removed during the polishing process in order to prevent damaging of the underlying materials, such as oxide and doped silicon.

The STI substrate is typically polished using a conventional polishing media and an abrasive containing polishing slurry. However, polishing STI substrates with conventional polishing media and abrasive containing polishing slurries has been observed to result in overpolishing of the substrate surface and form recesses in the STI features and other topographical defects such as microscratches on the substrate surface. This phenomenon of overpolishing and forming recesses in the STI features is referred to as dishing. Dishing is highly undesirable because dishing of substrate features may detrimentally affect device fabrication by causing failure of isolation of transistors and transistor components from one another resulting in short-circuits. Additionally, overpolishing of the substrate may also result in nitride loss and exposing the underlying silicon substrate to damage from polishing or chemical activity, which detrimentally affects device quality and performance.

One solution to limit dishing of substrate features is to polish a substrate surface with abrasive sheet polishing media. Abrasive sheet polishing media typically contains abrasive particles held in a containment media, which provide mechanical activity to the substrate surface along with the polishing media when contacting the substrate surface. However, abrasive sheet polishing media have been observed to excessively polish the underlying silicon nitride layer of STI substrates when polishing silicon oxide layers. The excessive nitride polishing results in nitride loss, exposing the underlying silicon substrate to damage from polishing or chemical activity, which detrimentally affects device quality and performance.

FIGS. 1A–1C are schematic diagrams illustrating the phenomena of dishing and nitride loss. FIG. 1A shows an example of one stage of the STI formation process with a silicon nitride layer 20 and thermal oxide layer 15 disposed and patterned on a substrate 10. A silicon oxide material 30 is deposited on the substrate surface in sufficient amounts to fill features 35.

FIG. 1B illustrates the phenomena of dishing observed with polishing by conventional techniques. During polishing of the silicon oxide material 30 to the silicon nitride layer 20, the silicon oxide material 30 may be overpolished and surface defects, such as recesses 40, may be formed in the silicon oxide material 30. The excess amount of silicon oxide material removed from overpolishing the substrate surface, represented by dashed lines, is considered the amount of dishing 50 of the feature.

FIG. 1C illustrates nitride loss from the surface of the silicon nitride layer 20 from excess polishing of the substrate surface with conventional polishing processes. Silicon nitride loss may take the form of excess removal of silicon nitride, or "thinning" of the silicon nitride layer, from the desired amount 60 of silicon nitride. The silicon nitride loss may render the silicon nitride layer 30 unable to prevent or limit damage to or contamination of the underlying substrate material during polishing or subsequent processing.

Therefore, there exists a need for a method and related polishing apparatus, which facilitates the removal of dielectric materials with minimal or reduced dishing and minimal or reduced loss of underlying materials.

SUMMARY OF THE INVENTION

The invention generally provides a method and composition for planarizing a substrate surface with selective removal rates and low dishing. In one aspect, the invention provides a method of processing a substrate including contacting a substrate having at least first and second dielectric materials disposed thereon with a polishing platen having polishing media disposed thereon, providing an abrasive free polishing composition comprising one or more surfactants to the substrate, and removing the first dielectric material at a higher removal rate than the second dielectric material.

In another aspect, the invention provides a method of processing a substrate, including providing a substrate having an oxide material disposed on a nitride material disposed thereon to a polishing platen having polishing media disposed thereon, providing a polishing composition consisting essentially of one or more surfactants, one or more pH adjusting agents, and deionized water, to a substrate surface, forming a removal resistant surface on the nitride material, and removing the oxide material and nitride material at a removal rate ratio of the oxide material to the nitride material between about 10:1 or greater.

Another aspect of the invention provides a system for processing substrates, including a platen adapted for polishing the substrate with polishing media and a computer based controller configured to cause the system to position a substrate having at least first and second dielectric materials disposed thereon on a polishing platen having polishing media disposed thereon, to deliver an abrasive free polishing composition comprising one or more surfactants to a substrate surface, to polish the substrate surface with the polishing media, and to remove the first dielectric material at a higher removal rate than the second dielectric material from a substrate surface.

Another aspect of the invention provides a method of processing a substrate including contacting a substrate having at least one dielectric material and one conductive material disposed thereon with a polishing platen having polishing media disposed thereon, providing an abrasive free polishing composition comprising one or more surfactants to the substrate, and removing the dielectric material at a higher removal rate than the conductive material.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

In general, aspects of the invention provide methods and compositions for planarizing a substrate surface with selective removal rates and low dishing. The invention will be described below in reference to a planarizing process for the removal of dielectric materials, such as silicon oxide and silicon nitride, as well as conductive materials, such as polysilicon or doped polysilicon, from a substrate surface by a chemical mechanical polishing (CMP) technique. Chemical-mechanical polishing is broadly defined herein as polishing a substrate by a combination of chemical and mechanical activity.

The invention will be described below in reference to a planarizing process and composition that can be carried out using chemical mechanical polishing process equipment, such as the Reflexion® CMP System available from Applied Materials, Inc., of Santa Clara, Calif. Although, the polishing process and composition described herein is illustrated utilizing the Reflexion® CMP System, any system enabling chemical mechanical polishing using the method or composition described herein, with conventional polishing media or abrasive sheet polishing media, can be used to advantage.

Figure 1A:
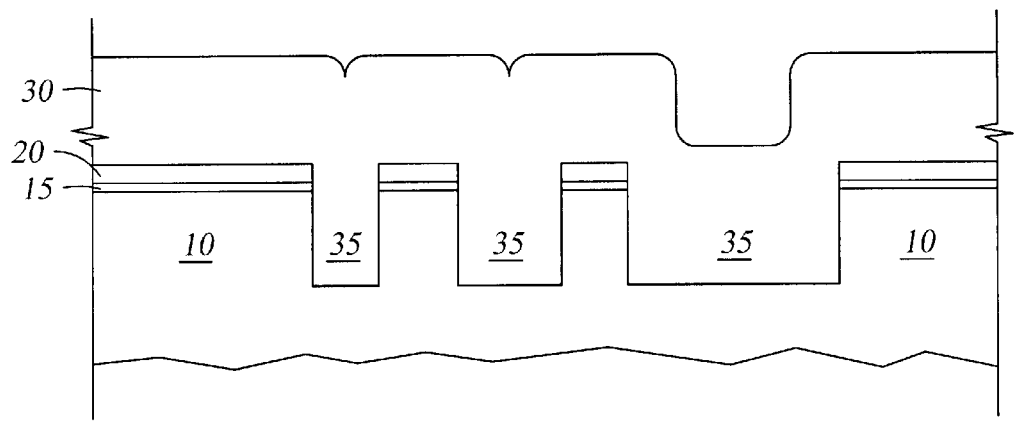
FIGS. 1A–1C are schematic diagrams illustrating the phenomena of dishing and nitride loss.
Figure 1B:
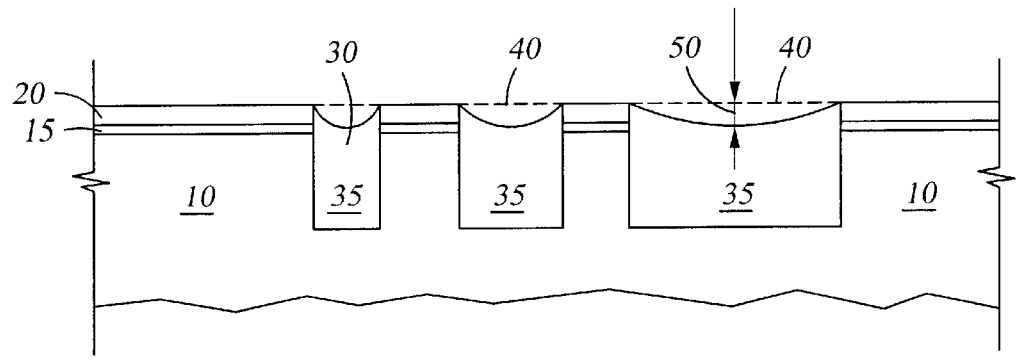
Figure 1C:
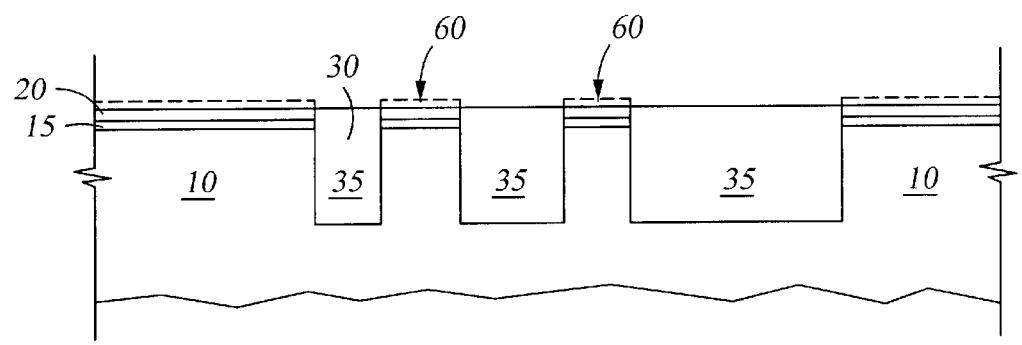
Figure 2:
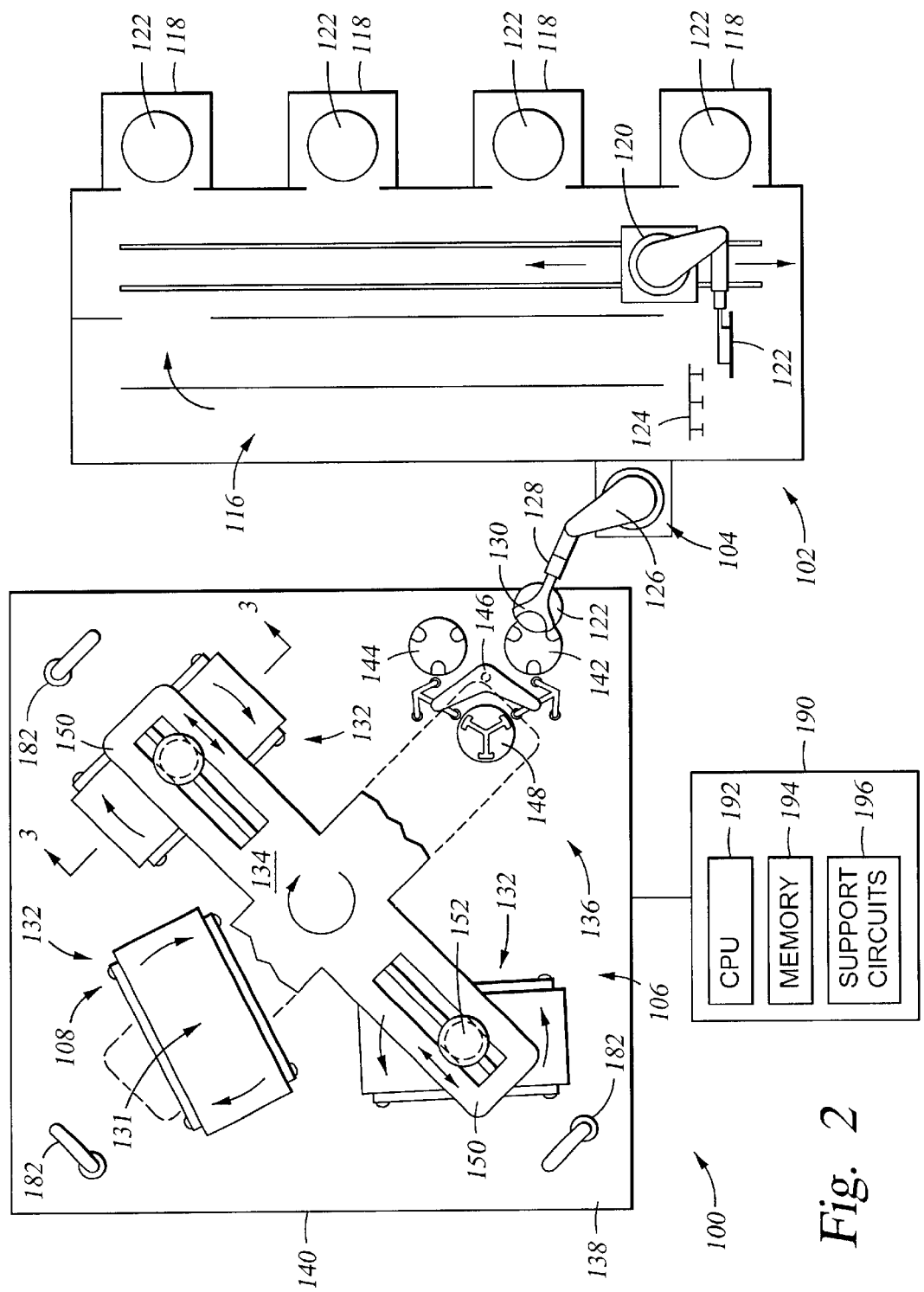
FIG. 2 is a plan view of one embodiment of a chemical mechanical planarization system of the invention.

FIG. 2 depicts a plan view of one embodiment of a chemical mechanical planarization system 100 generally having a factory interface 102, a loading robot 104, and one or more polishing modules 106, and one or more lift assemblies 108. Generally, the loading robot 104 is disposed proximate the factory interface 102 and the polishing module 106 to facilitate the transfer of substrates 122 therebetween.

A computer based controller 190 is connected to the polishing system or apparatus 120 for instructing the system to perform one or more processing steps on the system, such as polishing a substrate or transferring a substrate in the polishing apparatus 120. In one embodiment, the invention may be implemented as a computer program-product for use with a computer system or computer based controller 190. The programs defining the functions of an embodiment can be provided to a computer via a variety of signal-bearing media and/or computer readable media, which include but are not limited to, (i) information permanently stored on non-writable storage media (e.g., read-only memory devices within a computer such as read only CD-ROM disks readable by a CD-ROM or DVD drive; (ii) alterable information stored on a writable storage media (e.g., floppy disks within diskette drive or hard-disk drive); or (iii) information conveyed to a computer by communications medium, such as through a computer or telephone network, including wireless communication. Such signal-bearing media, when carrying computer-readable instructions that direct the functions of the invention, represent alternative embodiments of the present invention. It may also be noted that portions of the product program may be developed and implemented independently, but when combined together are embodiments of the present invention.

The factory interface 102 generally includes a cleaning module 116 and one or more substrate cassettes 118. An interface robot 120 is employed to transfer substrates 122 between the substrate cassettes 118, the cleaning module 116 and an input module 124. The input module 124 is positioned to facilitate transfer of substrates 122 between the polishing module 106 and the factory interface 102 by the loading robot 104. For example, unpolished substrates 122 retrieved from the cassettes 118 by the interface robot 120 may be transferred to the input module 124 where the substrates 122 may be accessed by the loading robot 104 while polished substrates 122 returning from the polishing module 106 may be placed in the input module 124 by the loading robot 104. Polished substrates 122 are typically passed from the input module 124 through the cleaning module 116 before the factory interface robot 120 returns the cleaned substrates 122 to the cassettes 118. An example of such a factory interface 102 that may be used to advantage is disclosed in U.S. patent application Ser. No. 09/547,189, filed Apr. 11, 2000, which is hereby incorporated by reference.

The loading robot 104 is generally positioned proximate the factory interface 102 and the polishing module 106 such that the range of motion provided by the robot 104 facilitates transfer of the substrates 122 therebetween. An example of a loading robot 104 is a 4-Link robot, manufactured by Kensington Laboratories, Inc., located in Richmond, Calif.

The exemplary loading robot 104 has an articulated arm 126 having a rotary actuator 128 at its distal end. An edge contact gripper 130 is coupled to the rotary actuator 128. The rotary actuator 128 permits the substrate 122 secured by the gripper 130 to be orientated in either a vertical or a horizontal orientation without contacting the feature side 120 of the substrate 122 and possibly causing scratching or damage to the exposed features. Additionally, the edge contact gripper 130 securely holds the substrate 122 during transfer, thus decreasing the probability that the substrate 122 will become disengaged. Optionally, other types of grippers, such as electrostatic grippers, vacuum grippers and mechanical clamps, may be substituted.

One polishing module 106 that can be used to advantage with the present invention is a Mirra® Chemical Mechanical Polisher, manufactured by Applied Materials, Inc., located in Santa Clara, Calif. Other polishing modules 102 including those that use polishing media, polishing webs, or a combination thereof may also be used to advantage. Other systems that benefit include systems that move a substrate relative a polishing surface in a rotational, linearly or in other motion within a plane.

The exemplary polishing module 106 has a transfer station 136, a plurality of polishing stations 132 and a carousel 134 disposed on an upper or first side 138 of a machine base 140. In one embodiment, the transfer station 136 comprises at least an input buffer station 142, an output buffer station 144, a transfer robot 146, and a load cup assembly 148. The loading robot 104 places the substrate 122 onto the input buffer station 142. The transfer robot 146 has two gripper assemblies, each having pneumatic gripper fingers that grab the substrate 122 by the substrate's edge. The transfer robot 146 lifts the substrate 122 from the input buffer station 142 and rotates the gripper and substrate 122 to position the substrate 122 over the load cup assembly 148, then places the substrate 122 down onto the load cup assembly 148. An example of a transfer station that may be used to advantage is described by Tobin in U.S. patent application Ser. No. 09/314,771, filed Oct. 6, 1999, which is hereby incorporated by reference.

The carousel 134 is generally described by Tolles in the previously incorporated U.S. Pat. No. 5,804,507. Generally, the carousel 134 is centrally disposed on the base 140. The carousel 134 typically includes a plurality of arms 150, each supporting a polishing head assembly 152. Two of the arms 150 depicted in FIG. 2 are shown in phantom such that a polishing surface 131 of one of the polishing stations 132 and the transfer station 136 may be seen. The carousel 134 is indexable such that the polishing head assemblies 152 may be moved between the polishing stations 132 and the transfer station 136.

Generally, a chemical mechanical polishing process is performed at each polishing station 132. A conditioning device 182 is disposed on the base 140 adjacent each polishing station 132. The conditioning device 182 periodically conditions the polishing surface 131 to maintain uniform polishing results.

A computer based controller 190 is connected to the polishing system or apparatus 120 for instructing the system to perform one or more processing steps on the system, such as polishing a substrate or transferring a substrate in the polishing apparatus 120.

Figure 3:
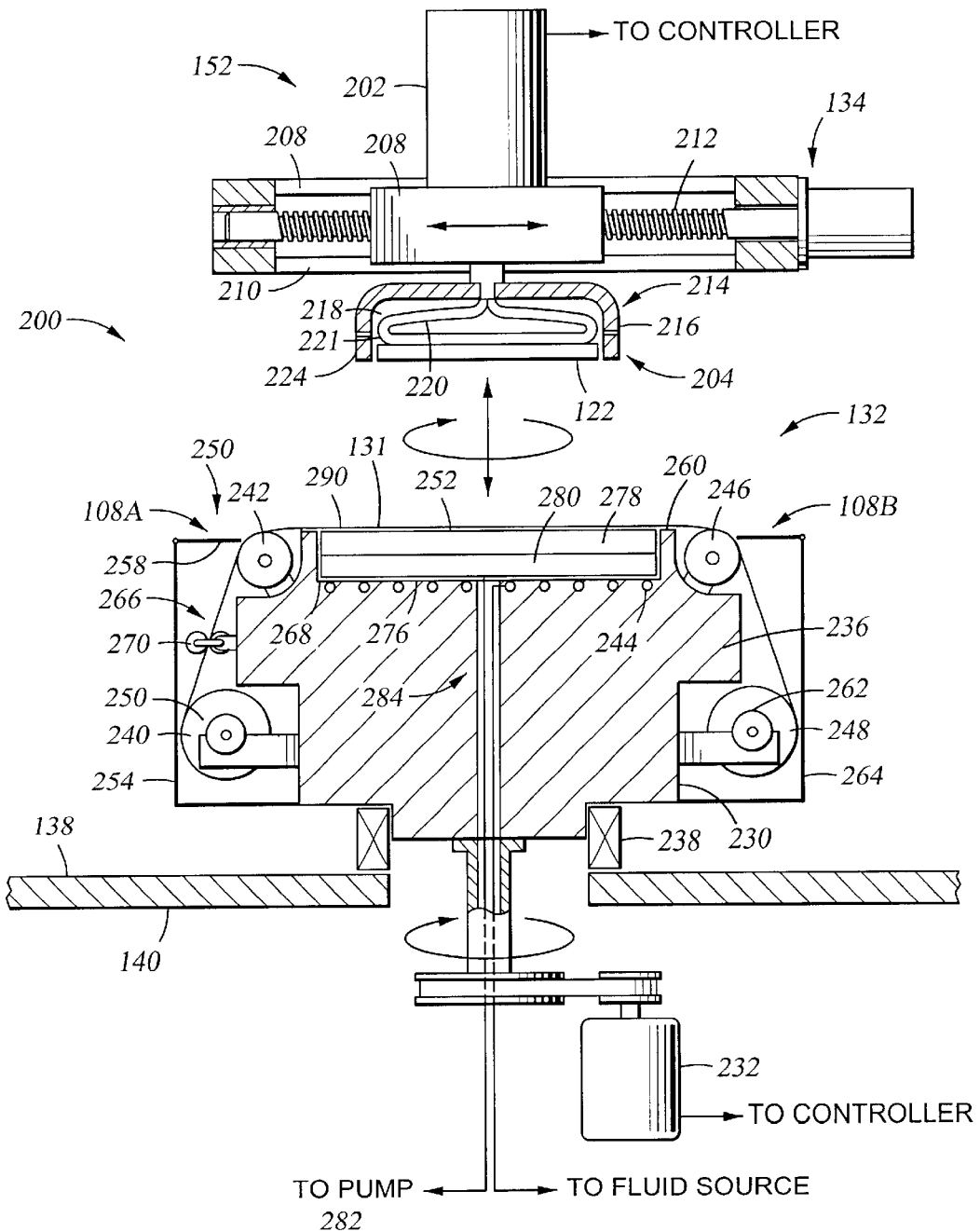
FIG. 3 is a sectional view of a polishing station taken along section line 3—3 of FIG. 2.

FIG. 3 depicts a sectional view of the polishing head assembly 152 supported above the polishing station 132. The polishing head assembly 152 generally comprises a drive system 202 coupled to a polishing head 204. The drive system 202 generally provides rotational motion to the polishing head 204. The polishing head 204 additionally may be actuated to extend towards the polishing station 132 such that the substrate 122 retained in the polishing head 204 may be disposed on the polishing station 132.

The drive system 202 is coupled to a carrier 208 that translates upon a rail 210 disposed in the arm 150 of the carousel 134. A ball screw or other linear motion device 212 couples the carrier 208 to the carousel 134 and positions the drive system 202 and polishing head 204 along the rail 210.

In one embodiment, the polishing head 204 is a TITAN HEAD™ substrate carrier manufactured by Applied Materials, Inc., Santa Clara, Calif. Generally, the polishing head 204 comprises a housing 214 having an extending lip 216 that defines a center recess 218 in which is disposed a bladder 220. The bladder 220 may be comprised of an elastomeric material or thermoplastic elastomer such as ethylene propylene, silicone and HYTREL™. The bladder 220 is coupled to a fluid source (not shown) such that the bladder 220 may be controllably inflated or deflated. The bladder 220, when in contact with the substrate 122, retains the substrate 122 within the polishing head 204 by deflating, thus creating a vacuum between the substrate 122 and the bladder 220. A retaining ring 224 circumscribes the polishing head 204 to retain the substrate 122 within the polishing head 204 while polishing.

Disposed between the polishing head assembly 154 and the polishing station 132 is polishing media, such as a web of polishing material 252. The web of polishing material 252 may have a smooth surface, a textured surface, a surface containing an abrasive in a binder material, or a combination thereof. In the aspect shown in FIGS. 2 and 3, the polishing material 252 is an abrasive sheet material. While the following description refers to polishing the substrate with an abrasive sheet polishing media, conventional polishing media may also be used in the methods described herein.

The web of polishing material 252 may be in the form of a roll or sheet (e.g., pad) of material that may be advanced across or releasably fixed to the polishing surface. Typically, the web of polishing material 252 is releasably fixed by adhesives, vacuum, mechanical clamps or by other holding methods to the platen 230.

The web of polishing material 252 may include abrasive sheet polishing media. Abrasive sheet typically comprises a plurality of abrasive particles suspending in a resin binder that may be disposed in discrete elements on a backing sheet. Examples of such abrasive sheet pads are described in U.S. Pat. No. 5,692,950, by Rutherford et al. (issued Dec. 2, 1997) and U.S. Pat. No. 5,453,312, by Haas et al. (issued Sep. 26, 1995), both of which are hereby incorporated by reference.

The web of polishing material 252 may optionally comprise conventional polishing material without abrasive sheets. Conventional polishing material is generally comprised of polyurethane. Conventional polishing material typically uses polishing fluids that includes entrained abrasives. Subpads used with conventional material are generally lower in hardness (i.e., softer) than the subpads typically used with abrasive sheet webs 252. Conventional material (i.e., pads without abrasive sheets) is available from Rodel, Inc., of Newark, Del.

The polishing station 132 generally comprises a platen 230 that is disposed on the base 140. The platen 230 is typically comprised of aluminum. The platen 230 is supported above the base 140 by a bearing 238 so that the platen 230 may rotate in relation to the base 140. An area of the base 140 circumscribed by the bearing 238 is open and provides a conduit for the electrical, mechanical, pneumatic, control signals and connections communicating with the platen 230.

Conventional bearings, rotary unions and slip rings (not shown) are provided such that electrical, mechanical, pneumatic, control signals and connections may be coupled between the base 140 and the rotating platen 230. The platen 230 is typically coupled to a motor 232 that provides the rotational motion to the platen 230.

The platen 230 has an upper portion 236 that supports the web of polishing material 252. A top surface 260 of the platen 230 contains a center recess 276 extending into the top portion 236. The top portion 236 may optionally include a plurality of passages 244 disposed adjacent to the recess 276. The passages 244 are coupled to a fluid source (not shown). Fluid flowing through the passages 244 may be used to control the temperature of the platen 230 and the polishing material 252 disposed thereon.

A subpad 278 and a subplate 280 are disposed in the center recess 276. The subpad 278 is typically a polymeric material, such as polycarbonate or foamed polyurethane. Generally, the hardness or durometer of the subpad may be chosen to produce a particular polishing result. The subpad 278 generally maintains the polishing material 252 parallel to the plane of the substrate 122 held in the polishing head 204 and promotes global planarization of the substrate 122. The subplate 280 is positioned between the subpad 278 and the bottom of the recess 276 such that the upper surface of the subpad 278 is coplanar with the top surface 260 of the platen 230.

Both the subpad 278 and the subplate 280 optionally contain a plurality of apertures (not shown) that are generally disposed in a pattern such that the polishing motion of the substrate 122 does not cause a discrete portion of the substrate 122 to pass repeatedly over the apertures while polishing as compared to the other portions of the substrate 122. A vacuum port 284 is provided in the recess 276 and is coupled to an external pump 282. When a vacuum is drawn through the vacuum port 284, the air removed between the polishing material 252 and the subpad 278 causes the polishing material 252 to be firmly secured to the subpad 278 during polishing.

An example of such polishing material retention system is disclosed in U.S. patent application Ser. No. 09/258,036, filed Feb. 25, 1999, by Sommer et al., which is hereby incorporated by reference. The reader should note that other types of devices might be utilized to fix the polishing material 252 to the platen 230, for example adhesives, bonding, electrostatic chucks, mechanical clamps and other retention mechanisms.

Optionally, to assist in releasing the polishing material 252 from the subpad 278 and platen 230 prior to advancing the polishing material 252, surface tension caused by fluid that may be disposed between the subpad 278 and the polishing material 252, a blast of gas (e.g., air) may be provided through the vacuum port 284 or other port (not shown) into the recess 276 by the pump 282 (or other pump). The air pressure within the recess 276 moves through the apertures (not shown) disposed in the subpad 278 and subplate 280 and lifts the polishing material 252 from the subpad 278 and the top surface 260 of the platen 230. The polishing material 252 rides upon the cushion of air such that it may be freely indexed across the platen 230.

Alternatively, the subpad 278 may be a porous material that permits gas (e.g., air) to permeate therethrough and lift the polishing material 252 from the platen 230. Such a method for releasing the web 252 is described in U.S. patent application Ser. No. 60/157,303, filed Oct. 1, 1999, by Butterfield, et al., and is hereby incorporated by reference in its entirety.

Mounted to one side of the platen 230 is a supply roll 240. The supply roll 240 generally contains a portion of the web of polishing media 252 wound thereon. The web of polishing media 252 is fed over a lift member 242 of the lift assembly 108A and across the top surface 260 of the platen. The web of polishing media 252 is fed over a lift member 246 of the lift assembly 108B and to a take-up roll 248 disposed to the other side of the platen 230. The lift members 242, 246 may be a roller, a rod, a bar or other member configured to allow the web 252 to move thereover with minimal damage to the web, particulate generation or contamination of the web.

The supply roll 240 is removably coupled to the platen 230 to facilitate loading another unwind roll containing unused polishing media once the web of polishing media 252 is consumed over the course of polishing a number of substrates. The supply roll 240 is coupled to a slip clutch 250 or similar device that prevents the web of polishing media 252 from inadvertently unwinding from the supply roll 240.

A housing 254 that protects the supply roll 240 from damage and contamination covers the supply roll 240. To further prevent contamination of the supply roll 240, a gas is disposed in the volume between the housing 254 and the platen 230 which flows out a gap 256 defined between an edge 258 of the housing 254 and the web of polishing media 252 disposed on the lift member 242. The gas flowing through the gap 256 prevents contaminants such as polishing fluids and byproducts from coming in contact with the unused portion of the web of polishing media 252 disposed on the supply roll 240 enclosed by the housing 254.

The take-up roll 248 generally is removably coupled to the platen 230 to facilitate removal of used polishing media that is wound thereon. The take-up roll 248 is coupled to a tensioning device 262 that keeps the web of polishing media 252 keeps taunt between the supply roll 240 and take-up roll 248. A housing 264 is disposed over the take-up roll 248 protects the take-up roll 248 from damage and contamination.

The web of polishing media 252 is advanced between the supply roll 240 and take-up roll 248 by an indexing means 266. In one embodiment, the indexing means 266 comprises a drive roller 268 and an idler 270 that pinches the web of polishing media 252 therebetween. The drive roller 256 generally is coupled the platen 230. The drive roller 256 is connected to a controlled motor such as a stepper and an encoder (motor and encoder not shown). The indexing means 266 enables a predetermined length of polishing to be pulled off the supply roll 240 by drive roller 256 as the drive roller 256 is controllably rotated. A corresponding length of polishing is wound on the take-up roll 248 as the web of polishing media 252 is advanced across the platen 230.

Before the web of polishing media 252 is advanced across the platen 230, at least one of the lift assemblies 108A or 108B is raised to an extended position to maintain the web of polishing media 252 in a spaced-apart relation to the platen 230. In a spaced-apart relation, the web 252 may be freely advanced without having to overcome surface tension due to fluid disposed between the web and the platen or possibly creating particulate by contacting the backside of the web with the platen while the web is moving.

To facilitate control of the system as described above, the controller 190 may include a CPU 192 of FIG. 2, which CPU 192 may be one of any form of computer processors that can be used in an industrial setting for controlling various chambers and subprocessors. The memory 194 is coupled to the CPU 192. The memory 194, or computer-readable medium, may be one or more of readily available memory, such as random access memory (RAM), read only memory (ROM), floppy disk, hard disk, or any other form of digital storage, local or remote. For storing information and instructions to be executed by the CPU 192.

The support circuits 196 are coupled to the CPU 192 for supporting the processor in a conventional manner. These circuits include cache, power supplies, clock circuits, input/output circuitry and subsystems, and can include input devices used with the controller 190, such as keyboards, trackballs, a mouse, and display devices, such as computer monitors, printers, and plotters. Such controllers 190 are commonly known as personal computers; however, the present invention is not limited to personal computers and can be implemented on workstations, minicomputers, mainframes, and supercomputers.

A process, such as the polishing processes described below, is generally stored in the memory 194, typically as a software routine. The software routine may also be stored and/or executed by a second CPU (not shown) that is remotely located from the hardware being controlled by the CPU 192.

Although the process of the present invention is discussed as being implemented as a software routine, some or all of the method steps may be performed in hardware as well as by the software controller. As such, the invention may be implemented in software as executed upon a computer system, in hardware as an application specific integrated circuit or other type of hardware implementation, or a combination of software and hardware.

Chemical Mechanical Polishing Process and Composition.

The words and phrases used herein should be given their ordinary and customary meaning in the art by one skilled in the art unless otherwise further defined. Polishing should be broadly construed and includes, but is not limited to, removing material from a substrate by the application of chemical activity, mechanical activity, or a combination of both chemical and mechanical activity to remove material from a substrate surface. Abrasive sheet media should be broadly construed and includes, but is not limited to, polishing media having abrasive particles disposed in a binder-material which contacts a substrate surface during polishing. Passivation is broadly defined herein as resistance to removal by chemical and/or mechanical activity. Passivation layer is broadly defined herein as a layer of material resistant to removal by chemical and/or mechanical activity that minimizes or reduces the removal of material disposed thereunder.

Planarizing processes and compositions are provided to modify the removal rates of one or more dielectric materials and to polish the one or more dielectric materials with conventional polishing media or abrasive sheet polishing media and compositions containing surfactant additives to reduce dishing and reduce loss of adjacent layers.

While the following description refers to chemically polishing a substrate surface with a fixed-abrasive polishing pad, the description is illustrative and should not be construed or interpreted as limiting the scope of the invention. While the following process embodiments are described for polishing a substrate having two dielectric materials using an abrasive sheet pad; it is contemplated that the process is applicable to processes for polishing multiple dielectric and conductive materials and is applicable to processes for polishing materials, both insulative and conductive materials, on which passivation layers may be formed from additives in chemical compositions.

Figure 4:
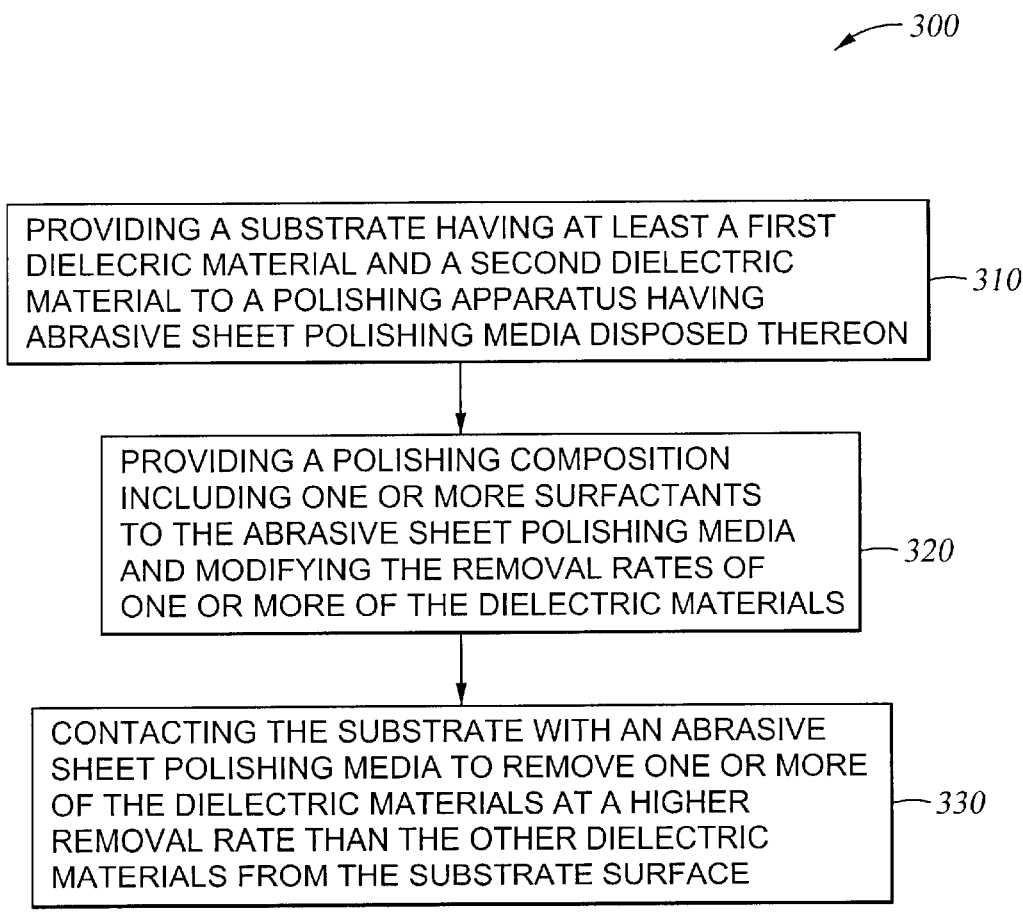
FIG. 4 is a flow chart illustrating the processing steps according to one embodiment of the invention.

FIG. 4 is a flow chart illustrating one embodiment of a process for planarizing a substrate surface. A method of planarizing a substrate surface 300 using an abrasive sheet polishing media and a polishing composition containing surfactant additives is provided as follows. A substrate having at least a first and a second dielectric material is provided to a polishing apparatus having abrasive sheet polishing media disposed thereon at Step 310. A polishing composition containing one or more surfactants is delivered to the polishing media disposed on the polishing apparatus at Step 320, wherein the one or more surfactants in the polishing composition modify the removal rates of one or more of the dielectric materials. The substrate and polishing media are contacted and one of the dielectric materials is removed from the substrate surface at a higher removal rate than the other material from the substrate surface at Step 330.

The substrate is positioned on a polishing platen containing the abrasive sheet polishing media disposed thereon at step 310. The substrate that may be polished by the process described herein may include shallow trench isolation structures formed in a series of dielectric layers, such as silicon oxide and silicon nitride.

The invention contemplates polishing dielectric materials conventionally employed in the manufacture of semiconductor devices, for example, silicon dioxide, silicon nitride, silicon oxy-nitride, phosphorus-doped silicon glass (PSG), boron-phosphorus-doped silicon glass (BPSG), and silicon dioxide derived from tetraethyl orthosilicate (TEOS), silane by plasma enhanced chemical vapor deposition (PECVD) can be employed, and combinations thereof. Conductive materials, such as non-metals including polysilicon and doped polysilicon, i.e., N-doped or P-doped polysilicon, and/or metal conductive materials, such as tungsten, aluminum, copper, platinum, ruthenium, and combinations thereof, may also be polished by the compositions described herein.

An abrasive sheet polishing media typically contains abrasive particles held in a containment or binder media which abrasive particles are released during the polishing process. The abrasive grains may have a particle size between about 0.1 and 1500 microns. Examples of such grains include silica, alumina, fused aluminum oxide, ceramic aluminum oxide, green silicon carbide, silicon carbide, chromia, alumina zirconia, diamond, iron oxide, ceria ($CeO_2$), cubic boron nitride, garnet and combinations thereof.

The binder material may be derived from a precursor, which includes an organic polymerizable resin that is cured form the binder material. Examples of such resins include phenolic resins, urea-formaldehyde resins, melamine formaldehyde resins, acrylated urethanes, acrylated epoxies, ethylenically unsaturated compounds, aminoplast derivatives having at least one pendant acrylate group, isocyanurate derivatives having at least one pendant acrylate group, vinyl ethers, epoxy resins, and combinations thereof.

In one aspect of the abrasive sheet polishing media, abrasive ceria ($CeO_2$) is disposed in a polyurethane binder material. The ceria is disposed in the binder at a concentration of abrasive particles between about 1 wt. % and about 50 wt. % of the polishing media. A ceria concentration of abrasive particles between about 1 wt. % and about 15 wt. % of the polishing media may also be used.

The abrasive sheet polishing media may in one embodiment include a multi-layered polishing media. A lower layer may be attached to platen by a pressure-sensitive adhesive layer and an upper layer typically will be between about 5 mils and about 200 mils thick abrasive composite layer, composed of abrasive grains held or embedded in a binder material. The lower layer typically will be between about 25 mils and about 200 mils thick backing layer, composed of a material such as a polymeric film, paper, cloth, a metallic film or the like.

Abrasive sheet polishing media are described in detail in the following U.S. patents, all of which are incorporated by reference to the extent not inconsistent with the invention as claimed and described herein: U.S. Pat. No. 5,152,917, issued on Oct. 6, 1992, and entitled "Structured Abrasive Article"; U.S. Pat. No. 5,342,419, issued on Aug. 30, 1994, and entitled "Abrasive Composites Having A Controlled Rate of Erosion, Articles Incorporating Same, And Methods of Making and Using Same"; U.S. Pat. No. 5,368,619, issued on Nov. 29, 1994, and entitled "Reduced Viscosity Slurries, Abrasive Articles Made Therefrom And Methods Of Making Said Articles"; and U.S. Pat. No. 5,378,251, issued on Jan. 3, 1995, and entitled "Abrasive Articles And Method Of Making And Using Same". Abrasive sheet pads are available from 3M Corporation of Minn., Minnesota and Rodel Inc., of Phoenix Ariz. Abrasive sheet polishing media is also commercially available from Marubeni America Corporation of Hayward, Calif.

A composition containing one or more surfactants is delivered to the polishing media at Step 320. The one or more surfactants can be present in an amount between about 0.01 volume percent (vol %) and about 20 vol % of the polishing composition. A concentration of surfactants between about 0.01 vol % and about 3 vol % may be used in the polishing composition. The one or more surfactants may comprise between about 0.02 vol % and about 0.5 vol % of the composition. The polishing composition is delivered or supplied to the abrasive sheet polishing media at a flow rate between about 5 ml/min and about 500 ml/min from a storage medium disposed in or near the system 100.

The polishing composition contains one or more surfactants that modify the removal rate of dielectric materials by forming a passivation layer on a dielectric material to reduce the removal rate of the material with the passivation layer formed thereon. A passivation layer can be formed, for example, by a selective absorption of an electronegative surfactant on the positive charged dielectric surface, e.g. silicon nitride or by modifying the hydration or complexation of the dielectric material surface, and thus its removal rate may be used in the composition.

An example of suitable surfactants having an affinity for positively charged compounds include electronegative surfactants, such as anionic surfactants. Examples of anionic surfactants include potassium oleate, sulfosuccinates, sulfosuccinate derivatives, sulfated fatty esters, phosphate esters, alkylanyl sulfonates, sulfates of alcohols including sulfates of ethoxylated alcohols, carboxylated alcohols, lignin, lignin derivatives, and combinations thereof.

Other surfactants useful in the composition include those which modify the removal rate of dielectric materials and which may selectively modify the removal rate of one or more dielectric materials in relation to other dielectric materials. Other examples of surfactants useful in the composition include non-ionic surfactants, such as ammonium polyacrylate, polyethylene oxide, and combinations thereof. The above described surfactants are illustrative and should not be construed or interpreted as limiting the scope of the invention as the invention contemplates the use of surfactant that may selectively form passivation layers on a number of materials.

The polishing composition may further include, one or more pH adjusting agents, deionized water, and optionally, a dispersant. The pH adjusting agents are provided to adjust the pH to improve polishing performance, such as by allowing a positive or negative charge to be developed on one or more materials disposed on a substrate surface and attract an appropriately charged surfactant.

The pH adjusting agents also affect the hydration of the dielectric layer, i.e., increase or decrease the formation of silanol groups (SiOH) which enhance non-selective removal of material from the substrate surface, or complexation, ie., selective formation of complexes with surface dielectric material, which may reduce respective dielectric removal rates. For example, an acidic pH increases silanol formation on silicon oxide and increase the ability to complex with the silicon oxide material.

The pH adjusting agents of the composition may be added to adjust the pH level of the composition to between about 6 and about 12. For example, a pH adjusting agent may be added to the composition in an amount sufficient to produce a pH of about neutral, i.e., a pH between about 6 and about 8. The pH adjusting agent or agents can comprise any of various bases, such as potassium hydroxide (KOH) and ammonium hydroxide, or inorganic and/or organic acids, such as acetic acid, phosphoric acid, or oxalic acid. The above-specified components are illustrative and should not be construed as limiting the invention.

Dispersants that may be added to the composition include sodium salts of polyacrylic acid, e.g., comprising molecular weights from about 1,000 to about 20,000, alkylphenol ethoxylate, and combinations thereof. The dispersants can be present in an amount between about 0.1 vol % and about 1 vol % of the composition. Dispersants are defined herein as compounds which have multiple ionic groups in one molecule, and which reduce the surface tension of the composition and promote uniform and maximum separation of solids, such as by-products of the CMP process and abrasive particles in a composition. The above described compositions and concentrations are provided for illustrative purposes and should not be construed as limiting the invention. It is contemplated that the compounds used and concentrations may be varied to provide desired removal rates, desired materials to be removed, and amount of the desired materials to be removed from the substrate surface.

An example of a polishing composition and abrasive concentration includes between about 0.02 vol % and about 0.5 vol % of sulfosuccinate, or between about 0.02 weight percent (wt. %) and about 10 wt. % of polycarboxylate, distilled water, and potassium hydroxide as a pH adjusting agent in a sufficient amount to produce a pH level of about 7. An abrasive sheet polishing media containing ceria abrasives in a polyurethane binder in an equivalent concentration between about 1 wt. % and about 50 wt. % of the polishing media may be used with the polishing composition to remove material from the substrate surface.

The substrate and polishing media are contacted and one of the dielectric materials is removed a higher removal rate than the other material from the substrate surface at Step 330. The presence of the surfactants in the polishing composition provides a selective resistance to removal of desired compounds during polishing by forming a passivating layer. The material having a passivated layer selectively formed thereon may be removed at a rate between about 0 Å/min and about 100 Å/min, and the material free of passivation may be removed at a rate between about 100 Å/min and about 5000 Å/min. A removal rate ratio, or selectivity, of the first material, such as silicon oxide, to the second material, such as silicon nitride, between about 10:1 and about 1500:1 may be achieved by the use of the surfactants in a composition described herein. A removal rate of first material to second material of between about 10:1 and about 100:1 may be used for the processes described herein. However, the removal rates and removal rate ratios can vary on the processing parameters and polishing composition used.

An example of a polishing process includes moving polishing media relative to the substrate at a rate between about 15 rpm and about 200 rpm for a for a polishing media disposed on a linear polishing system, using a sliding or circulating polishing belt or similar device. The polishing media is moved relative to the substrate at a rate between about 25 rpm and about 100 rpm for a for a polishing media disposed on a round or rotatable platen polishing system. A pressure between about 0.5 psi and about 6.0 psi between the substrate and the polishing media is used to provide mechanical activity to the polishing process. Alternatively, the invention contemplates polishing the substrate on a variety of polishing platens, such as rotatable platens, rotatable linear platens, and orbital polishing platens.

It has been observed that the resulting features formed in the dielectric materials with the CMP compositions described herein exhibit improved planarization at desired polishing rates for various applications. The CMP composition containing the one or more surfactants produced an improved STI polish quality without detrimentally affecting the polishing performance.

While the mechanism is not completely understood, it is believed that the one or more surfactants in the polishing composition modify the removal rates of the dielectric materials on the substrate surface by forming a removal resistant, or passivation layer, on at least one material on the substrate surface.

Figure 5A:
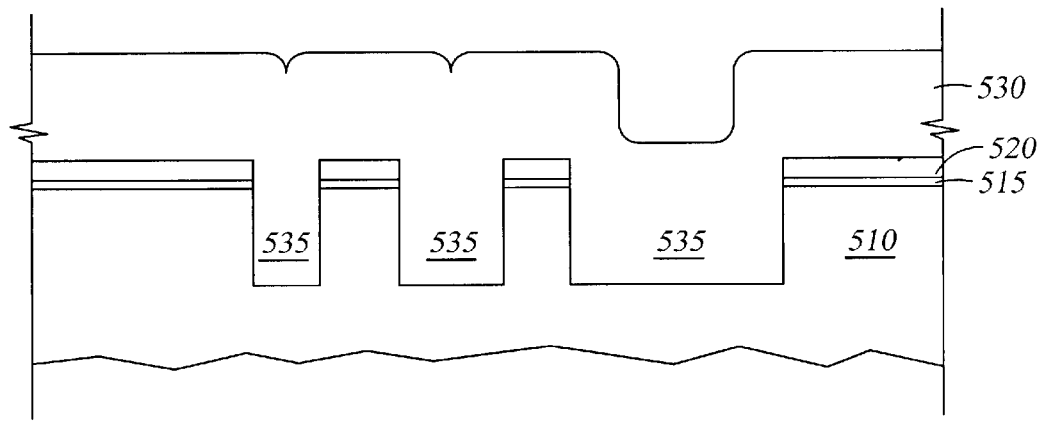
FIGS. 5A–5B are schematic diagrams illustrating one embodiment of polishing a substrate by the methods described herein.
Figure 5B:
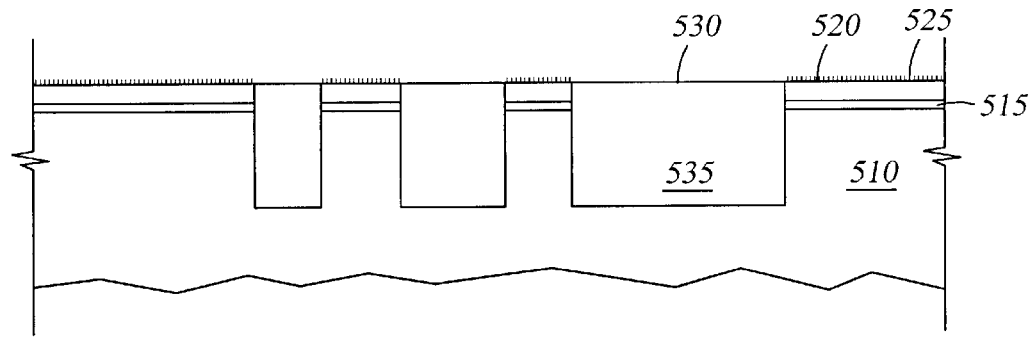

FIGS. 5A–5B illustrate the formation of a passivation layer and selective removal of materials from the substrate surface. FIG. 5A shows an example of substrate materials deposited for the STI formation process. A silicon nitride layer 520 and thermal oxide layer 515 are disposed and patterned over a polysilicon layer (or doped polysilicon layer) 510. The polysilicon layer is etched to form feature definitions 535, which are then filled by depositing a silicon oxide material 530 over the substrate surface. The silicon oxide is then etched using the composition described herein to expose the silicon nitride layer. A passivation layer 525 is formed on the silicon nitride layer when exposed to the polishing composition described herein as shown in FIG. 5B. Polishing is continued and the silicon oxide material 530 is removed while the silicon nitride layer 520 remains substantially unpolished. Subsequent to ending the polishing process, the silicon nitride layer 520 may be removed prior to further substrate processing.

One possible mechanism is the surfactant complexes with Si—OH surface group of the silicon nitride film and suppresses material removal. Another possible mechanism is the removal resistant layer formation process begins with exposing the at least two dielectric materials to a composition having a pH to form positively and negatively charged surfaces of materials to be formed.

For example, at a pH of about 7, a surface of a first material, such as silicon oxide, is negatively charged and a surface of a second material, such as silicon nitride is positively charged. Electronegative surfactants are then attracted to the positively charged dielectric material surface and diffuse into the dielectric material to form a passivation layer between about 5 Å and about 20000 Å thick, but typically forms a passivation layer between about 10 Å and about 50 Å thick. It is further believed that by controlling the type and concentration of the one or more surfactants in the composition, the removal rate of the passivated and passivation free materials can be controlled to provide for selective removal of material from the substrate surface.

The polishing composition herein may also be used to enhance removal of dielectric materials over conductive materials in abrasive sheet applications. The surfactants of the invention may form passivation layers on conductive materials, such as polysilicon, depending upon the pH and surfactants used, while dielectric materials, such as silicon oxide, free of passivation layers may be selectively removed. Conductive materials include, but are not limited to, polysilicon, doped polysilicon, tungsten, aluminum, copper, platinum, ruthenium, and combinations thereof.

Surfactants in the composition that may used to form a passivation layer on conductive materials, include ammonium polyacrylate, polyethylene oxide, and combinations thereof. For example, polyethylene surfactants have been observed to selectively remove oxide from polysilicon in abrasive sheet polishing media applications. The composition for selectively removing dielectric material over conductive material generally comprises between about 0.01 volume percent (vol %) and about 20 vol % surfactants. A surfactant concentration between about 0.01 vol % and about 3 vol % may be used in the polishing composition. The one or more surfactants may comprise between about 0.02 vol % and about 0.5 vol % of the composition. The composition may further include a pH adjusting agent, deionized water, and, optionally, a dispersant as described above.

The invention contemplates removing the dielectric material at a rate between about 100 Å/min and about 5000 Å/min and removing the conductive material is removed at a rate between about 0 Å/min and about 100 Å/min. A removal rate ratio, or selectivity of the dielectric material to the conductive material between about 10:1 and about 1500:1 is contemplated by the invention. The invention contemplates the use of additional surfactants other than those illustrated above to passivate the conductive materials.

EXAMPLE

An example of a polishing process described herein comprises delivering a polishing composition to an abrasive sheet polishing media containing ceria abrasive particles at a flow rate between 50 ml/min and about 500 ml/min, the polishing composition including between about 0.02 vol % and about 0.5 vol % of sulfosuccinate or between about 0.02 wt. % and 10 wt. % of polycarboxylate, distilled water, and potassium hydroxide as a pH adjusting agent in a sufficient amount to produce a pH level between of about 10.5 and 12. A polishing pressure between about 2 and about 6 psi, and a polishing speed between about 25 rpm and about 100 rpm for a polishing duration between about 30 seconds and about 300 seconds to planarize a substrate.

While the foregoing is directed to the one or more embodiments of the invention, other and further embodiments of the invention may be devised without departing from the basic scope thereof, and the scope thereof is determined by the claims that follow including their equivalents.

What is claimed is:

1. A method of processing a substrate, comprising:
   contacting the substrate having at least first and second dielectric materials disposed thereon with a polishing platen having polishing media disposed thereon;
   providing an abrasive free polishing composition comprising one or more electronegative surfactants to the substrate; and
   removing the first dielectric material at a higher removal rate than the second dielectric material.

2. The method of claim 1, wherein the one or more electronegative surfactants are selected from the group of potassium oleate, sulfosuccinates, sulfosuccinate derivatives, sulfated fatty esters, phosphate esters, alkylanyl sulfonates, sulfates of alcohols, carboxylated alcohols, lignin, lignin derivatives, and combinations thereof.

3. The method of claim 1, wherein the one or more electronegative surfactants comprise between about 0.02 vol % and about 10 vol % of the composition.

4. The method of claim 1, wherein the polishing composition further comprises a dispersant, one or more pH adjusting agents, deionized water, or combinations thereof.

5. The method of claim 1, wherein the first dielectric material is an oxide and the second dielectric material is a nitride.

6. The method of claim 5, wherein the oxide is silicon oxide and the nitride is silicon nitride.

7. The method of claim 1, wherein the first dielectric material is removed at a rate between about 100 Å/min and about 5000 Å/min.

8. The method of claim 1, wherein the second dielectric material is removed at a rate between about 0 Å/min and about 100 Å/min.

9. The method of claim 1, wherein the first dielectric material and the second dielectric material are removed at a removal rate ratio of the first material to the second material of about 10:1 or greater.

10. A method of processing a substrate, comprising:
    providing the substrate having an oxide material disposed on a nitride material disposed thereon to a polishing platen having polishing media disposed thereon;
    providing a polishing composition consisting essentially of one or more electronegative surfactants, one or more pH adjusting agents, and deionized water, to a substrate surface;
    forming a removal resistant surface on the nitride material; and
    removing the oxide material and nitride material at a removal rate ratio of the oxide material to the nitride material between about 10:1 or greater.

11. The method of claim 10, wherein the oxide material is silicon oxide and the nitride material is silicon nitride.

12. The method of claim 10, wherein the one or more electronegative surfactants are surfactants selected from the group of potassium oleate, sulfosuccinates, sulfosuccinate derivatives, sulfates of ethoxylated alcohols, sulfated fatty esters, phosphate esters, alkylanyl sulfonates, sulfates of alcohols, carboxylated alcohols, lignin, lignin derivatives, and combinations thereof.

13. The method of claim 12, wherein the one or more electronegative surfactants comprise between about 0.02 vol % and about 10 vol % of the composition.

14. The method of claim 10, wherein the polishing composition further comprises a dispersant.

15. A method of processing a substrate, comprising:
    contacting the substrate having at least one dielectric material and one conductive material disposed thereon with a polishing platen having polishing media disposed thereon;
    providing an abrasive free polishing composition comprising one or more electronegative surfactants to the substrate; and
    removing the dielectric material at a higher removal rate than the conductive material.

16. The method of claim 15, wherein the one or more electronegative surfactants are selected from the group of potassium oleate, sulfosuccinates, sulfosuccinate derivatives, sulfated fatty esters, phosphate esters, alkylanyl sulfonates, sulfates of alcohols, carboxylated alcohols, lignin, lignin derivatives, and combinations thereof.

17. The method of claim 15, wherein the one or more electronegative surfactants comprise between about 0.02 vol % and about 10 vol % of the composition.

18. The method of claim 15, wherein the dielectric material is silicon oxide, and the conductive material comprises polysilicon or doped polysilicon.

19. The method of claim 15, wherein the dielectric material is removed at a rate between about 100 Å/min and about 5000 Å/min.

20. The method of claim 15, wherein the conductive material is removed at a rate between about 0 Å/min and about 100 Å/min.

21. The method of claim 15, wherein the dielectric material and the conductive material are removed at a removal rate ratio of the dielectric material to the conductive material between about 10:1 and about 1500:1.

22. A method of processing a substrate having at least first and second materials disposed thereon, comprising:
    contacting the substrate with a polishing platen having fixed abrasive polishing media disposed thereon;
    providing an abrasive free polishing composition comprising one or more electronegative surfactants to the substrate; and removing the first material at a higher removal rate than the second material.

23. The method of claim 22, wherein the one or more electronegative surfactants are selected from the group of potassium oleate, sulfosuccinates, sulfosuccinate derivatives, sulfated fatty esters, phosphate esters, alkylanyl sulfonates, sulfates of alcohols, carboxylated alcohols, lignin, lignin derivatives, and combinations thereof.

24. The method of claim 23, wherein the one or more electronegative surfactants comprise between about 0.02 vol % and about 10 vol % of the composition.

25. A method of processing a substrate having an oxide material and a second material disposed thereon, comprising:

providing the substrate to a polishing platen having polishing media disposed thereon;

providing a polishing composition comprising one or more electronegative surfactants, one or more pH adjusting agents, and deionized water to the substrate surface;

forming a removal resistant surface on the second material; and removing the oxide material at a higher removal rate than the second material.

26. The method of claim 25, wherein the one or more electronegative surfactants are selected from the group of potassium oleate, sulfosuccinates, sulfosuccinate derivatives, sulfated fatty esters, phosphate esters, alkylanyl sulfonates, sulfates of alcohols, carboxylated alcohols, lignin, lignin derivatives, and combinations thereof.

27. The method of claim 26, wherein the one or more electronegative surfactants comprise between about 0.02 vol % and about 10 vol % of the composition.

28. A method of processing a substrate having at least an oxide material and a nitride material disposed thereon, comprising:

contacting the substrate with a polishing platen having polishing media disposed thereon;

providing an abrasive free polishing composition comprising one or more electronegative surfactants to the substrate; and removing the oxide material at a higher removal rate than the nitride material.

29. The method of claim 28, wherein the one or more electronegative surfactants are selected from the group of potassium oleate, sulfosuccinates, sulfosuccinate derivatives, sulfated fatty esters, phosphate esters, alkylanyl sulfonates, sulfates of alcohols, carboxylated alcohols, lignin, lignin derivatives, and combinations thereof.

30. The method of claim 29, wherein the one or more ionic surfactants comprise between about 0.02 vol % and about 10 vol % of the composition.

31. A method of processing a substrate having at least an oxide material and a nitride material disposed thereon, comprising:

contacting the substrate with a polishing platen having polishing media disposed thereon;

providing to the substrate an abrasive free polishing composition comprising one or more surfactants having a higher affinity for the nitride material than the oxide material; and removing the oxide material at a higher removal rate than the nitride material.

32. The method of claim 31, wherein the one or more surfactants are selected from the group of potassium oleate, sulfosuccinates, sulfosuccinate derivatives, sulfated fatty esters, phosphate esters, alkylanyl sulfonates, sulfates of alcohols, carboxylated alcohols, lignin, lignin derivatives, ammonium polyacrylate, polyethylene oxide, and combinations thereof.

33. The method of claim 32, wherein the one or more surfactants comprise between about 0.02 vol % and about 10 vol % of the composition.

* * * * *